United States Patent
Oba et al.

(10) Patent No.: US 8,661,919 B2
(45) Date of Patent: Mar. 4, 2014

(54) LIQUID SAMPLE HEATING VAPORIZER

(75) Inventors: Hidenori Oba, Kyoto (JP); Tadayuki Nagano, Kyoto (JP)

(73) Assignee: Horiba STEC, Co., Ltd., Kyoto-shi (JP)

( * ) Notice: Subject to any disclaimer, the term of this patent is extended or adjusted under 35 U.S.C. 154(b) by 33 days.

(21) Appl. No.: 13/182,401

(22) Filed: Jul. 13, 2011

(65) Prior Publication Data

US 2012/0011943 A1 Jan. 19, 2012

(30) Foreign Application Priority Data

Jul. 14, 2010 (JP) .................................. 2010-159767

(51) Int. Cl.
*G01N 1/44* (2006.01)
*B01F 3/04* (2006.01)

(52) U.S. Cl.
USPC ..................... 73/863.11; 73/863.01; 261/129; 261/130; 261/131

(58) Field of Classification Search
USPC ........... 73/863.01, 863.11; 261/129, 130, 131
See application file for complete search history.

(56) References Cited

U.S. PATENT DOCUMENTS

| | | | |
|---|---|---|---|
| 3,020,975 A | | 2/1962 | Lupfer |
| 3,107,516 A | * | 10/1963 | Markey ............................ 374/27 |
| 3,987,133 A | * | 10/1976 | Andra ............................ 261/130 |
| 4,618,462 A | * | 10/1986 | Fisher ............................ 261/130 |
| 5,402,668 A | * | 4/1995 | Murakami et al. ............ 73/19.02 |
| 5,520,858 A | * | 5/1996 | Yamaguchi et al. ........... 261/130 |
| 6,715,743 B2 | * | 4/2004 | Zhang ............................ 261/130 |
| 6,863,268 B2 | * | 3/2005 | Zhang ............................ 261/130 |
| 6,988,717 B2 | * | 1/2006 | Han ............................... 261/128 |
| 2008/0279736 A1 | * | 11/2008 | Frinke et al. .................. 422/293 |

FOREIGN PATENT DOCUMENTS

JP 2002-336680 A 11/2002

OTHER PUBLICATIONS

European Patent Office, Extended European Search Report of EP11173535.3, Oct. 31, 2011, Germany, 5 pages.

* cited by examiner

*Primary Examiner* — Randy W Gibson
*Assistant Examiner* — Natalie Huls
(74) *Attorney, Agent, or Firm* — Alleman Hall McCoy Russell & Tuttle LLP

(57) ABSTRACT

The present invention is intended to improve response property and accuracy of temperature control of a liquid sample, and is provided with a vaporization tank that retains the liquid sample, one or more heaters that are provided in the vaporization tank and respectively have heating parts that come into contact with the liquid sample to heat the liquid sample, a temperature detection part that is provided in contact with an outer surface including the heating part of any of the heaters and detects a temperature of the outer surface, and a control part that receives a temperature detection signal from the temperature detection part to control electric power supplied to the heaters.

2 Claims, 6 Drawing Sheets

LIQUID SAMPLE HEATING VAPORIZER

TECHNICAL FIELD

The present invention relates to a liquid sample heating vaporizer for heating and vaporizing a liquid sample retained in a vaporization tank.

BACKGROUND ART

A conventional liquid sample heating vaporizer is, as illustrated in FIG. 6, provided with a vaporization tank having an inlet port for introducing a liquid sample and an outlet port for leading out a vaporized liquid sample, and heaters for heating and vaporizing the liquid sample retained in the vaporization tank. The heaters are provided outside a bottom wall and side walls, and configured to heat the liquid sample through the bottom and side walls. Temperature control of the liquid sample at the time of heating is performed by using temperature detection values from a liquid temperature sensor that detects a temperature of the liquid sample, and a heater temperature sensor provided for the heaters.

However, in the above configuration, surfaces that heat the liquid sample are an inside surface of the bottom wall and inside surfaces of the side walls, and because of heat transfer, in order for an inside surface temperature of the bottom wall or the like to become equal to a heater temperature, a time lag occurs. As a result, there exists a problem that the response property of the temperature control of the liquid sample is poor. Also, even in the case of performing the temperature control with use of the temperature detection values of the liquid temperature sensor and the heater temperature sensor, the temperature on the inside surface of the bottom wall or the like serving as a heating surface is unknown, and therefore it is difficult to perform the temperature control with high accuracy. In particular, in the case where a temperature enabling a required vapor pressure to be ensured, and a temperature (decomposition point) causing it to be thermally decomposed are close to each other, in the configuration in which the response property of the temperature control is poor, and highly accurate temperature control cannot be performed as described above, the liquid sample is thermally decomposed, and a problem becomes significant.

In addition, in order to solve a problem of a temperature reduction near a liquid surface, which is one of problems inherent in temperature control of a liquid sample, Patent literature 1 describes a vaporizing tank in which a cartridge heater is arranged near a liquid surface. The cartridge heater includes a heating wire and a tubular metallic containing body that contains the hearing wire, and is placed by being inserted inside from a side wall of the vaporizing tank.

In the above configuration, in order to perform temperature control of the cartridge heater, inside the metallic containing body of the cartridge heater, a temperature sensor that detects a temperature of the heating wire is provided. A temperature detection signal from the temperature sensor is obtained by a control part to thereby control electric power supplied to the heating wire of the cartridge heater.

However, heat from the heating wire is transferred to a liquid sample through the outside metallic containing body, and therefore a time lag occurs before the temperature of the heating wire and a temperature of the metallic containing body become equal to each other. If so, as described above, the control response property is poor, and controlling to a set temperature with high accuracy is also difficult.

CITATION LIST

Patent Literature

Patent literature 1: JP 2002-336680A

SUMMARY OF THE INVENTION

Technical Problem

In order to improve the response property and accuracy of temperature control, conventional approaches have focused on a control mode such as how a temperature detection signal is used. On the other hand, the present invention is made as a result of intensively examining the arrangement of a temperature sensor, and a main object thereof is to improve the response property and accuracy of temperature control of a liquid sample.

Solution to Problem

Accordingly, a liquid sample heating vaporizer according to the present invention is provided with a vaporization tank that has a inlet port for introducing a liquid sample and an outlet port for leading out a vaporized liquid sample, and retains the liquid sample; one or more heaters that are provided in the vaporization tank and respectively have heating parts that come into contact with the liquid sample to heat the liquid sample; a heater temperature detection part that is provided in contact with an outer surface including the heating part of at least one of the heaters and detects a temperature of the outer surface; and a control part that receives a temperature detection signal from the heater temperature detection part to control electric power supplied to the heaters.

If so, by providing the heater temperature detection part in contact with the outer surface including the heating part of the heater, the problem due to the time lag, which conventionally occurs, can be solved to improve the response property and accuracy of temperature control of the liquid sample. In particular, even in the case where a temperature enabling a required vapor pressure to be ensured and a temperature (decomposition point) causing it to be thermally decomposed are close to each other, the temperature of the outer surface including the heating part that comes into contact with the liquid sample is detected, so that a temperature of the liquid sample can be surely controlled to less than the decomposition point, and a problem of thermal decomposition of the liquid sample can also be solved.

If each of the heaters is a rod-like heater that is inserted in the vaporization tank, a contact area between the liquid sample and the heating part can be increased as much as possible to efficiently heat the liquid sample. This enables the large volume vaporized liquid sample to be supplied even though the small-sized vaporization tank is used.

In this case, from the perspective of making it easy to ensure airtightness of the vaporization tank, the heater temperature detection part is preferably provided in contact with the outer surface that is positioned outside the vaporization tank. Also, by arranging the heater temperature detection part in this manner, the thermal decomposition of the liquid sample can be further prevented. That is, in the heater, a temperature of the outer surface that is in contact with outside air outside the vaporization tank is made higher than a temperature of the heating part that is in contact with the liquid sample. By detecting the higher temperature of the outer surface to perform temperature control such as controlling the detection temperature of the outer surface to less than the decomposition point, the thermal decomposition of the liquid sample can be preferably prevented.

Advantageous Effects of Invention

According to the present invention configured as described, the response property and accuracy of temperature control of a liquid sample can be improved.

DETAILED DESCRIPTION OF THE EMBODIMENTS

One embodiment of a sample gas supply system using a liquid sample heating vaporizer according to the present invention will hereinafter be described with reference to the drawings.
<System Configuration>

Figure 1:
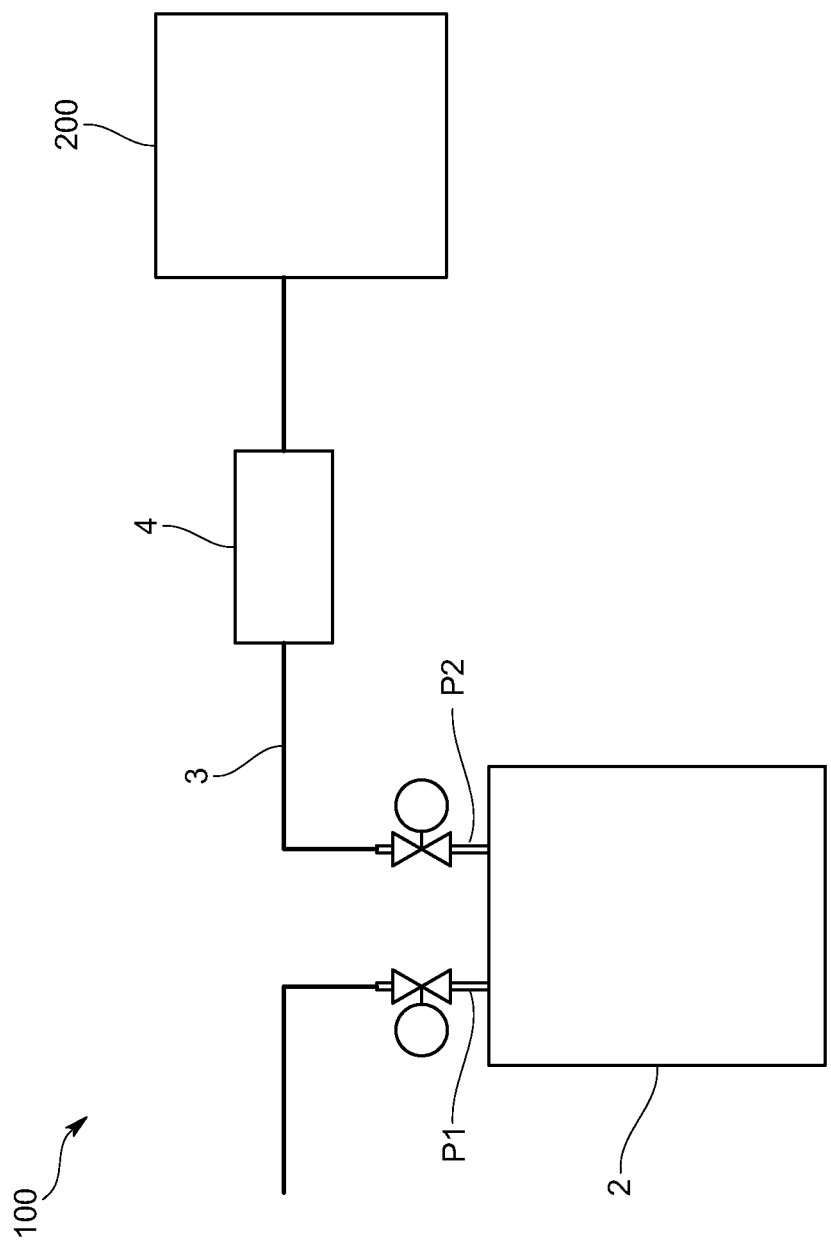
FIG. 1 is a schematic diagram illustrating one embodiment of a sample gas supply system of the present invention.

A sample gas supply system 100 according to the present embodiment is one that is incorporated in, for example, a semiconductor manufacturing system or a solar cell manufacturing system, and as illustrated in FIG. 1, is provided with a liquid sample heating vaporizer 2 that heats and vaporizes a liquid sample, a supply line 3 that is connected to an outlet port P2 of the liquid sample heating vaporizer 2 to supply a vaporized liquid sample (hereinafter referred to as sample gas) to a target device 200 such as a chamber, and a flow rate control device 4 that is provided in the supply line 3 and controls a flow rate of the sample gas, such as a mass flow controller (MFC). In the present embodiment, as the liquid sample, a sample of which a temperature enabling a required vapor pressure to be ensured and a temperature (decomposition point) causing the liquid sample itself to be thermally decomposed are close to each other is used, such as diethyl zinc (($C_2H_5$)$_2$Zn, DEZ), trimethylaluminum (($CH_3$)$_3$Al, TMA), trimethylgallium (($CH_3$)$_3$Ga, TMGa), triethylgallium (($C_2H_5$)$_3$Ga), Tetrakis(ethylmethylamino)hafnium (Hf[N($CH_3$)($C_2H_5$)]$_4$), or Tetrakis(ethylmethylamino)zirconium (Zr[N($CH_3$)($C_2H_5$)]$_4$, TEMAZ). Also, the sample that is easily thermally decomposed is used, and therefore as a flow rate sensor incorporated in the flow rate control device 4, not a thermal flow rate sensor but a differential pressure flow rate sensor is used.

Figure 2:
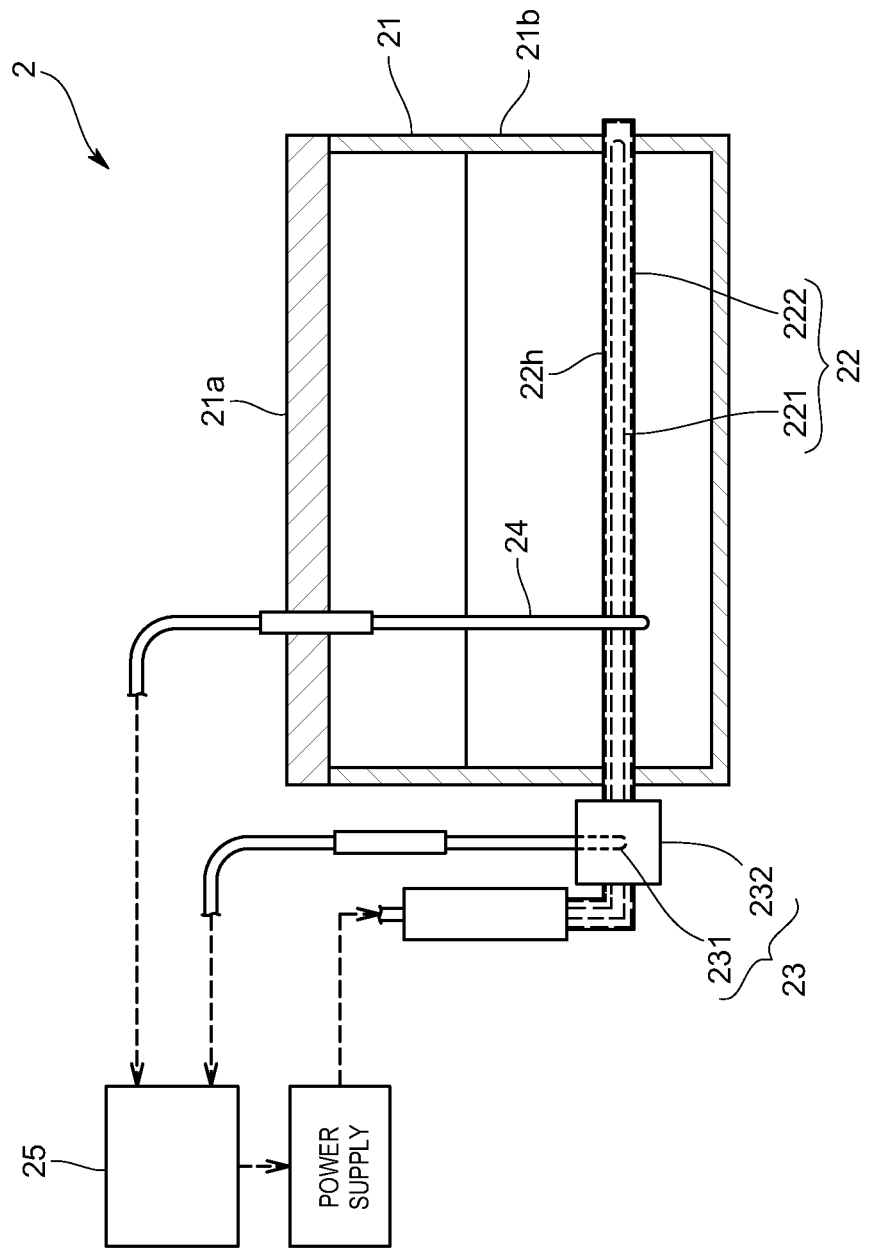
FIG. 2 is a schematic cross-sectional view illustrating a configuration of a liquid sample heating vaporizer of the same embodiment.

Also, the liquid sample heating vaporizer 2 of the present embodiment is, as illustrated in FIG. 2, provided with a vaporization tank 21 that retains the liquid sample, a plurality of heaters 22 that are provided in the vaporization tank 21 and intended to heat and vaporize the liquid sample, a heater temperature detection part 23 that is provided for the heaters 22 to detect a temperature of the heaters 22, a liquid temperature detection part 24 that is immersed in the liquid sample retained in the vaporization tank 21 and detects a temperature of the liquid sample, and a control part 25 that receives detection signals from the heater temperature detection part 23 and the liquid temperature detection part 24 to control electric power supplied to the heaters 22.

In the following, the respective parts 21 to 25 are described.

Figure 3:
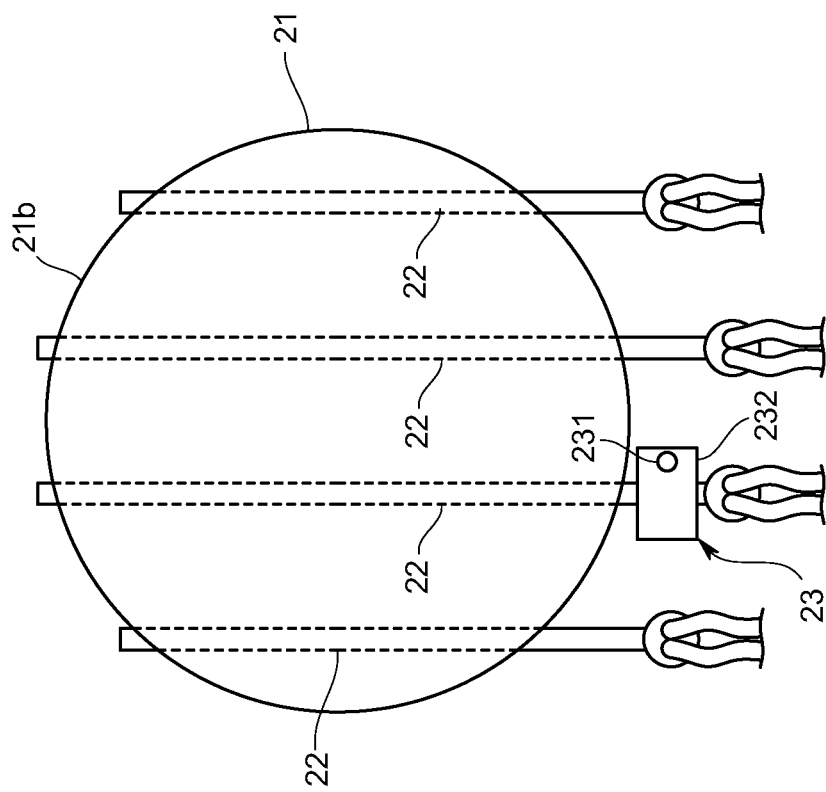
FIG. 3 is a schematic plan view illustrating the configuration of the liquid sample heating vaporizer of the same embodiment.

The vaporization tank 21 is, as illustrated in FIGS. 2 and 3, a metallic one that has substantially a hollow cylindrical shape. Also, an upper wall 21a of the vaporization tank 21 is provided with an inlet port P1 for introducing the liquid sample inside and the outlet port P2 for leading out the liquid sample vaporized (sample gas) in the vaporization tank 21. Note that each of the inlet port P1 and the outlet port P2 is provided with an on-off valve to switch between the introduction of the liquid sample and the leading-out of the sample gas. Also, the inlet port P1 is connected with an unillustrated liquid sample container, from which the liquid sample is supplied to the vaporization tank 21.

Each of the heaters 22 is a rod-like heater that is provided in the vaporization tank 21 by being inserted into mounting holes provided through a side peripheral wall 21b of the vaporization tank 21. Each of the heaters 22 of the present embodiment is a so-called cartridge heater including a heating wire 221 and a cylindrical metallic containing body 222 that contains the heating wire 221. The heaters 22 are provided in the vaporization tank 21 so as to extend in a horizontal direction from the peripheral wall 21b and also pass across a space inside the vaporization tank 21. A tip part of each of the heaters 22 is welded to one of the mounting holes of the vaporization tank 21, and a base end part is also welded to the other mounting hole of the vaporization tank 21. The plurality of (in the present embodiment, four) heaters 22 are horizontally provided parallel to each other at regular intervals (see FIG. 3). Also wattages per unit length of the heaters 22 are the same.

Each of the heaters 22 has a heating surface 22h serving as a heating part that comes into contact with the liquid sample retained in the vaporization tank 21 to heat the liquid sample. The heating surface 22h corresponds to, in a state where each of the heaters 22 is inserted in and attached to the vaporization tank 21, an outer surface of the heater 22 positioned in the vaporization tank 21, which is a surface that comes into contact with the liquid sample to directly transfer heat. In the present embodiment, each of the heaters 22 includes the heating wire 221 and the metallic containing body 222, and therefore the heating surface 22h is an outer surface of the metallic containing body 222 positioned in the vaporization tank 21.

The heater temperature detection part 23 is provided in contact with a part of the outer surface including the heating surface 22h of at least one of the heaters 22, and possibly in contact with the outer surface of more than one or all of the heaters 22. In this configuration, the heather temperature detection part 23 detects a temperature of the outer surface of the heater 22 with which it is in contact. Specifically, the heater temperature detection part 23 is provided on at least one of the plurality of heaters 22, and is provided in contact with the outer surface of the metallic containing body 222 of the heater 22. In the present embodiment, the heater temperature detection part 23 is provided so as to, in the state where the heater 22 is inserted in and attached to the vaporization tank 21, come into contact with the outer surface of the metallic containing body 222 positioned outside the vaporization tank 21. This causes airtightness of the vaporization tank 21 to be easily ensured to guarantee safety, and also the heater temperature detection part 23 to be easily attached to reduce cost. Note that a temperature detection value obtained by the heater temperature detection part 23 indicates substantially the same temperature as that of the heating surface 22h of the heater 22.

Figure 4:
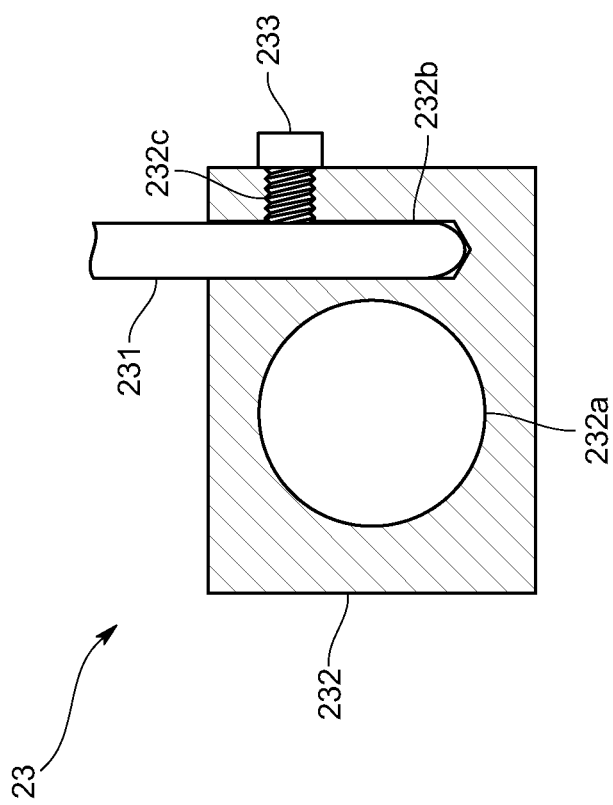
FIG. 4 is a side view illustrating a configuration of a sensor holding block of the same embodiment.

Specifically, the heater temperature detection part 23 is, as illustrated in FIG. 4, provided with a temperature sensor main body 231 and a sensor holding block 232 that holds the temperature sensor main body 231 and transfers heat from the metallic containing body 222 to the temperature sensor main body 231. The temperature sensor main body 231 is one using, for example, a platinum resistance temperature detector, and a detection signal obtained by the temperature sensor main body 231 is outputted to the control part 25.

The sensor holding block 232 is provided with a through-hole 232a into which the metallic containing body 222 of the heater 22 is inserted. The through-hole 232a is fitted to an outer peripheral surface of the metallic containing body 222 of the heater 22, and thereby an inner peripheral surface of the through-hole 232a is brought into contact with the outer peripheral surface of the metallic containing body 222. Also, the sensor holding block 232 is provided with an insertion hole 232b for inserting and fixing the temperature sensor main body 231 in a position adjacent to the through-hole 232a. The insertion hole 232b is opened at the top thereof, and the temperature sensor main body 231 is inserted from above. Also, in a state where the temperature sensor main body 231 is inserted, by screwing a locking screw 233 in a female screw hole 232c that is communicatively connected to the insertion hole 232b and is orthogonal to the insertion hole 232b, a tip surface of the locking screw 233 presses the sensor main body 231 against the sensor holding block 232 to fix it.

The sensor holding block 232 is configured with use of a material superior in thermal conductance, such as aluminum, and makes it easy to transfer heat from the heater 22 to the sensor main body 231. That is, the sensor holding block 232 is configured such that after heating has been started by the heater 22, a temperature of the sensor main body 231 is made higher than a temperature of the liquid sample heated by the heater 22. In other words, the sensor holding block 232 is configured to have a higher thermal conductivity than that of the liquid sample. This enables the temperature detection value obtained by the sensor main body 231 to be made higher than the temperature of the liquid sample, and by controlling the temperature detection value of the temperature sensor main body 231 to less than the decomposition point of the liquid sample, the liquid sample can be surely prevented from being thermally decomposed.

The liquid temperature detection part 24 is, as illustrated in FIG. 2, arranged in the vaporization tank 21 so as to be able to detect a liquid temperature of the liquid sample in the vaporization tank 21. The liquid temperature detection part 24 is, as with the temperature sensor main body 231, one using, for example, a platinum resistance temperature detector, and the detection signal obtained by the liquid temperature detection part 24 is outputted to the control part 25. Also, the liquid temperature detection part 24 is fixed by being inserted into a mounting hole for sensor insertion provided through an upper wall 21a of the vaporization tank 21, and configured such that a tip part thereof (sensing part) is arranged in a position lower than the heaters 22.

The control part 25 receives the detection signal indicating the temperature of the heating surface 22h from the heater temperature detection part 23 (temperature sensor main body 231) and the detection signal indicating the liquid temperature from the liquid temperature detection part 24 to perform ON/OFF control of a power supply connected to the heaters 22 on the basis of cascade control.

Figure 5:
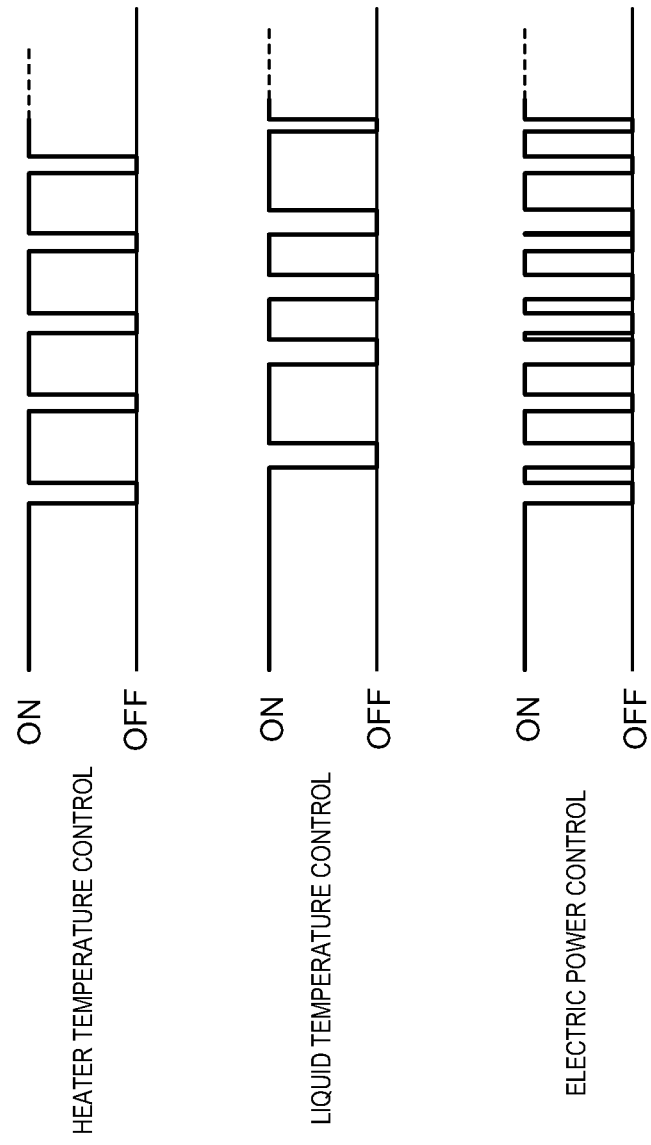
FIG. 5 is a schematic diagram illustrating a control mode of a heater of the same embodiment.
Figure 6:
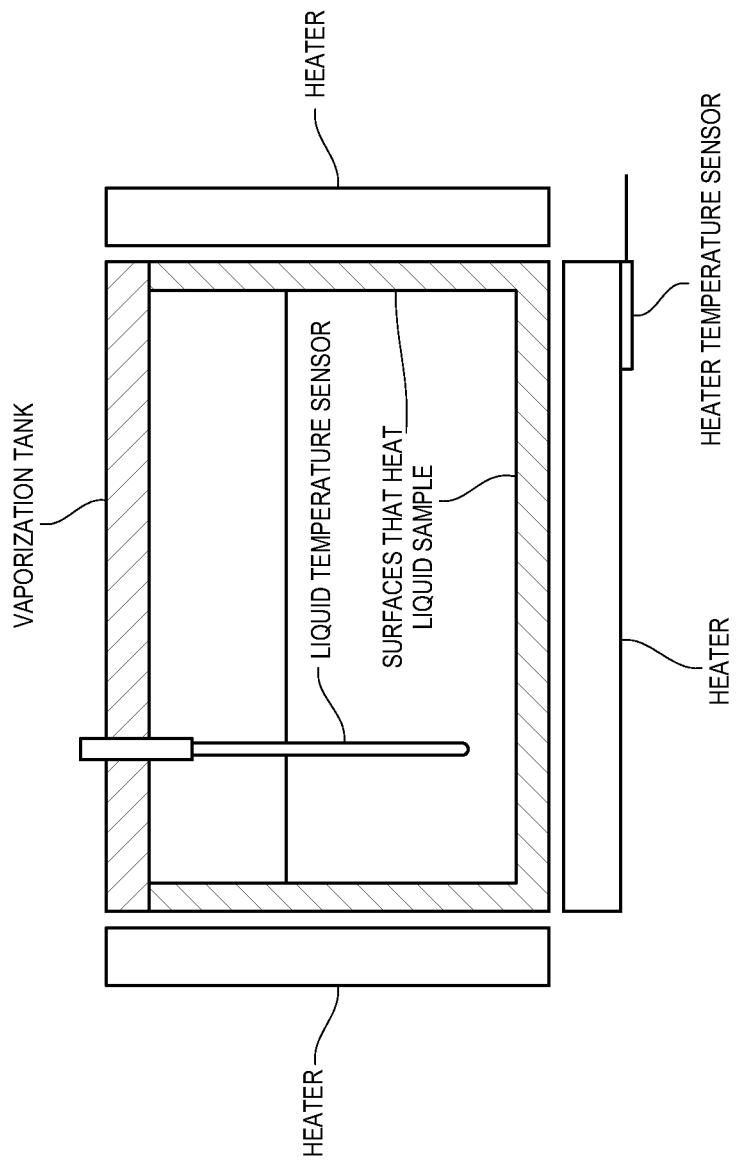
FIG. 6 is a schematic diagram illustrating a configuration of a conventional liquid sample heating vaporizer.

Specifically, the control part 25 compares a predetermined set temperature (e.g., 60° C.) of the heating surface 22h to the temperature of the heating surface 22h obtained by the temperature sensor main body 231, and also compares a predetermined liquid temperature (e.g., 55° C.) to the liquid temperature obtained by the liquid temperature detection part 24. Then, on the basis of these comparisons, the control part 25 generates an ON/OFF signal for heating surface temperature control, and also generates an ON/OFF signal for liquid temperature control (upper part of FIG. 5). The control part 25 compares these ON/OFF signals with each other, and only in the case where ON signals of the both ON/OFF signals overlap with each other, performs control to supply electric power to the heaters 22 (lower part of FIG. 5).

<Effects of the Present Embodiment>

According to the gas supply system 100 of the present embodiment configured as described, the heater temperature detection part 23 is provided to be in contact with the outer surface including the heating surface 22h of the heater 22, so that the problem due to the time lag in heat transfer, which conventionally occurs, can be solved to improve the response property and accuracy of temperature control of the liquid sample. In particular, even in the case where a temperature enabling a required vapor pressure to be ensured and a temperature (decomposition point) causing it to be thermally decomposed are close to each other, a temperature of the outer surface including the heating surface 22h that comes into contact with the liquid sample can be detected, so that a temperature of the liquid sample can be surely controlled to less than the decomposition temperature to solve the problem of thermal decomposition of the liquid sample.

Also, the heater 22 is a rod-like cartridge heater, and is provided to be inserted in the vaporization tank 21, so that a contact area between the liquid sample and the heating surface 22h can be increased as much as possible to efficiently heat the liquid sample. This enables the large volume vaporized liquid sample to be supplied even though the small-sized vaporization tank 21 is used.

<Other Variations>

Note that the present invention is not limited to the above embodiment.

For example, in the above embodiment, the heater temperature detection part is provided on the outer surface of the heater that is positioned outside the vaporization tank; however, the heater temperature detection part may be provided so as to be in contact with the outer surface (heating surface) of the heater that is positioned inside the vaporization tank.

Also, the heater temperature detection part may be configured to include only the temperature sensor main body, and the temperature sensor main body may be fixed so as to be in contact with the outer peripheral surface of the heater with use of heat resistant tape for sensor fixation.

Besides, it should be appreciated that the present invention is not limited to the above embodiment, and various variations can be made without departing from the scope of the present invention.

REFERENCE CHARACTER LIST

100: Gas supply system
2: Liquid sample heating vaporizer
4: Flow rate control device
21: Vaporization tank
P1: Inlet port
P2: Outlet port
22: Heater
22h: Heating surface (heating part)

23: Heater temperature detection part
231: Temperature sensor main body
232: Sensor holding block
25: Control part

The invention claimed is:

1. A liquid sample heating vaporizer comprising:
a vaporization tank that has an inlet port for introducing a liquid sample and an outlet port for leading out a vaporized liquid sample, and retains the liquid sample;
one or more heaters that are provided in the vaporization tank and respectively have heating parts that come into contact with the liquid sample to heat the liquid sample, the heating parts are a part of an outer surface of the one or more heaters;
a heater temperature detection part that is provided being in contact with the outer surface of at least one of the one or more heaters and detects a temperature of the outer surface; and
a control part that receives a temperature detection signal from the heater temperature detection part to control electric power supplied to the heaters in order to maintain the liquid sample at a designated temperature.

2. The liquid sample heating vaporizer according to claim 1, wherein:
the one or more heaters are rod-like heaters that are provided to be inserted in the vaporization tank; and
the heater temperature detection part is provided being in contact with the outer surface that is positioned outside the vaporization tank.

* * * * *